(12) United States Patent
Carvalho et al.

(10) Patent No.: US 10,775,408 B2
(45) Date of Patent: Sep. 15, 2020

(54) SYSTEM FOR TESTING DEVICES INSIDE OF CARRIERS

(71) Applicant: Teradyne, Inc., North Reading, MA (US)

(72) Inventors: Valquirio Nazare Carvalho, Lowell, MA (US); Shant Orchanian, Winchester, MA (US); Peter Addison Reichert, Boston, MA (US)

(73) Assignee: TERADYNE, INC., North Reading, MA (US)

( * ) Notice: Subject to any disclaimer, the term of this patent is extended or adjusted under 35 U.S.C. 154(b) by 127 days.

(21) Appl. No.: 16/105,179

(22) Filed: Aug. 20, 2018

(65) Prior Publication Data
US 2020/0057093 A1 Feb. 20, 2020

(51) Int. Cl.
*G01R 31/04* (2006.01)
*G01R 1/04* (2006.01)
*G01R 31/3185* (2006.01)

(52) U.S. Cl.
CPC ... *G01R 1/0408* (2013.01); *G01R 31/318533* (2013.01)

(58) Field of Classification Search
CPC . H01L 24/14; H01L 25/0652; H01L 2924/14; H01L 21/67775; G06F 11/263; G06F 11/2733; G06F 11/2273; G06F 11/27; G06F 30/39; G06F 8/443; G06F 11/22; G01R 31/2834; G01R 31/318505; G01R 31/318536; G01R 1/0433; G01R 31/2893; G01R 31/31905; G01R 31/2601; G01R 31/2865; G01R 31/31907; G01R 31/31908; G01R 31/2806; G01R 31/2831; G01R 31/2851; G01R 31/31724; G01R 31/3187; G01R 1/0408; G01R 31/2882; G01R 31/2889; G01R 31/303; G01R 31/3177; G01R 31/318533; G01R 31/31912; G01R 31/318357; G01R 31/318513;
(Continued)

(56) References Cited

U.S. PATENT DOCUMENTS 557,186 A 3/1896 Cahill
2,224,407 A 12/1940 Passur
(Continued)

FOREIGN PATENT DOCUMENTS

AU 583716 B2 5/1989
CN 1114109 A 12/1995
(Continued)

OTHER PUBLICATIONS

International Search Report for PCT/US2019/38909, 3 pages (dated Oct. 11, 2019).
(Continued)

*Primary Examiner* — Vinh P Nguyen
(74) *Attorney, Agent, or Firm* — Burns & Levinson LLP

(57) ABSTRACT

An example test system includes a test carrier to receive a device to test. The test carrier includes test components to perform at least a structural test on the device. The example test system also includes a slot to receive the test carrier. The slot includes an interface to which the test carrier connects to enable the test carrier to communicate with a system that is part of the test system or external to the test system.

32 Claims, 4 Drawing Sheets

(58) Field of Classification Search
CPC .... G01R 31/318519; G01R 31/318525; G01R 31/318541; G01R 31/318544; G01R 31/318577; G11C 29/56; G11C 2029/5602; G11C 29/56016
See application file for complete search history.

(56) References Cited

U.S. PATENT DOCUMENTS

| | | |
|---|---|---|
| 2,380,026 A | 7/1945 | Clarke |
| 2,631,775 A | 3/1953 | Gordon |
| 2,635,524 A | 4/1953 | Jenkins |
| 3,120,166 A | 2/1964 | Lyman |
| 3,360,032 A | 12/1967 | Sherwood |
| 3,364,838 A | 1/1968 | Bradley |
| 3,517,601 A | 6/1970 | Courchesne |
| 3,845,286 A | 10/1974 | Aronstein et al. |
| 4,147,299 A | 4/1979 | Freeman |
| 4,233,644 A | 11/1980 | Hwang et al. |
| 4,336,748 A | 6/1982 | Martin et al. |
| 4,379,259 A | 4/1983 | Varadi et al. |
| 4,477,127 A | 10/1984 | Kume |
| 4,495,545 A | 1/1985 | Dufresne et al. |
| 4,526,318 A | 7/1985 | Fleming et al. |
| 4,620,248 A | 10/1986 | Gitzendanner |
| 4,648,007 A | 3/1987 | Garner |
| 4,654,727 A | 3/1987 | Blum et al. |
| 4,654,732 A | 3/1987 | Mesher |
| 4,665,455 A | 5/1987 | Mesher |
| 4,683,424 A | 7/1987 | Cutright et al. |
| 4,685,303 A | 8/1987 | Branc et al. |
| 4,688,124 A | 8/1987 | Scribner et al. |
| 4,700,293 A * | 10/1987 | Grone .................. G06F 11/273 324/73.1 |
| 4,713,714 A | 12/1987 | Gatti et al. |
| 4,739,444 A | 4/1988 | Zushi et al. |
| 4,754,397 A | 6/1988 | Varaiya et al. |
| 4,768,285 A | 9/1988 | Woodman, Jr. |
| 4,775,281 A | 10/1988 | Prentakis |
| 4,778,063 A | 10/1988 | Ueberreiter |
| 4,801,234 A | 1/1989 | Cedrone |
| 4,809,881 A | 3/1989 | Becker |
| 4,817,273 A | 4/1989 | Lape et al. |
| 4,817,934 A | 4/1989 | McCormick et al. |
| 4,851,965 A | 7/1989 | Gabuzda et al. |
| 4,881,591 A | 11/1989 | Rignall |
| 4,888,549 A | 12/1989 | Wilson et al. |
| 4,911,281 A | 3/1990 | Jenkner |
| 4,967,155 A | 10/1990 | Magnuson |
| 5,012,187 A | 4/1991 | Littlebury |
| 5,045,960 A | 9/1991 | Eding |
| 5,061,630 A | 10/1991 | Knopf et al. |
| 5,094,584 A | 3/1992 | Bullock |
| 5,119,270 A | 6/1992 | Bolton et al. |
| 5,122,914 A | 6/1992 | Hanson |
| 5,127,684 A | 7/1992 | Klotz et al. |
| 5,128,813 A | 7/1992 | Lee |
| 5,136,395 A | 8/1992 | Ishii et al. |
| 5,143,193 A | 9/1992 | Geraci |
| 5,158,132 A | 10/1992 | Guillemot |
| 5,168,424 A | 12/1992 | Bolton et al. |
| 5,171,183 A | 12/1992 | Pollard et al. |
| 5,173,819 A | 12/1992 | Takahashi et al. |
| 5,176,202 A | 1/1993 | Richard |
| 5,205,132 A | 4/1993 | Fu |
| 5,206,772 A | 4/1993 | Hirano et al. |
| 5,207,613 A | 5/1993 | Ferchau et al. |
| 5,210,680 A | 5/1993 | Scheibler |
| 5,237,484 A | 8/1993 | Ferchau et al. |
| 5,263,537 A | 11/1993 | Plucinski et al. |
| 5,268,637 A | 12/1993 | Liken et al. |
| 5,269,698 A | 12/1993 | Singer |
| 5,295,392 A | 3/1994 | Hensel et al. |
| 5,309,323 A | 5/1994 | Gray et al. |
| 5,325,263 A | 6/1994 | Singer et al. |
| 5,343,403 A | 8/1994 | Beidle et al. |
| 5,349,486 A | 9/1994 | Sugimoto et al. |
| 5,368,072 A | 11/1994 | Cote |
| 5,374,395 A | 12/1994 | Robinson et al. |
| 5,379,229 A | 1/1995 | Parsons et al. |
| 5,398,058 A | 3/1995 | Hattori |
| 5,412,534 A | 5/1995 | Cutts et al. |
| 5,414,591 A | 5/1995 | Kimura et al. |
| 5,426,581 A | 6/1995 | Kishi et al. |
| 5,469,037 A | 11/1995 | McMurtrey, Sr. et al. |
| 5,477,416 A | 12/1995 | Schkrohowsky et al. |
| 5,484,012 A | 1/1996 | Hiratsuka |
| 5,486,681 A | 1/1996 | Dagnac et al. |
| 5,491,610 A | 2/1996 | Mok et al. |
| 5,543,727 A | 8/1996 | Bushard et al. |
| 5,546,250 A | 8/1996 | Diel |
| 5,557,186 A | 9/1996 | McMurtrey, Sr. et al. |
| 5,563,768 A | 10/1996 | Perdue |
| 5,570,740 A | 11/1996 | Flores et al. |
| 5,593,380 A | 1/1997 | Bittikofer |
| 5,601,141 A | 2/1997 | Gordon et al. |
| 5,604,662 A | 2/1997 | Anderson et al. |
| 5,610,893 A | 3/1997 | Soga et al. |
| 5,617,430 A | 4/1997 | Angelotti et al. |
| 5,644,705 A | 7/1997 | Stanley |
| 5,646,918 A | 7/1997 | Dimitri et al. |
| 5,654,846 A | 8/1997 | Wicks et al. |
| 5,673,029 A | 9/1997 | Behl et al. |
| 5,694,290 A | 12/1997 | Chang |
| 5,703,843 A | 12/1997 | Katsuyama et al. |
| 5,718,627 A | 2/1998 | Wicks |
| 5,718,628 A | 2/1998 | Nakazato et al. |
| 5,731,928 A | 3/1998 | Jabbari et al. |
| 5,751,549 A | 5/1998 | Eberhardt et al. |
| 5,754,365 A | 5/1998 | Beck et al. |
| 5,761,032 A | 6/1998 | Jones |
| 5,793,610 A | 8/1998 | Schmitt et al. |
| 5,811,678 A | 9/1998 | Hirano |
| 5,812,761 A | 9/1998 | Seki et al. |
| 5,813,817 A | 9/1998 | Matsumiya et al. |
| 5,819,842 A | 10/1998 | Potter et al. |
| 5,831,525 A | 11/1998 | Harvey |
| 5,851,143 A | 12/1998 | Hamid |
| 5,859,409 A | 1/1999 | Kim et al. |
| 5,859,540 A | 1/1999 | Fukumoto |
| 5,862,037 A | 1/1999 | Behl |
| 5,870,630 A | 2/1999 | Reasoner et al. |
| 5,886,639 A | 3/1999 | Behl et al. |
| 5,890,959 A | 4/1999 | Pettit et al. |
| 5,892,367 A | 4/1999 | Magee et al. |
| 5,912,799 A | 6/1999 | Grouell et al. |
| 5,913,926 A | 6/1999 | Anderson et al. |
| 5,914,856 A | 6/1999 | Morton et al. |
| 5,927,386 A | 7/1999 | Lin |
| 5,955,877 A | 9/1999 | Farnworth |
| 5,956,301 A | 9/1999 | Dimitri et al. |
| 5,959,834 A | 9/1999 | Chang |
| 5,999,356 A | 12/1999 | Dimitri et al. |
| 5,999,365 A | 12/1999 | Hasegawa et al. |
| 6,000,623 A | 12/1999 | Blatti et al. |
| 6,005,404 A | 12/1999 | Cochran et al. |
| 6,005,770 A | 12/1999 | Schmitt |
| 6,008,636 A | 12/1999 | Miller et al. |
| 6,008,984 A | 12/1999 | Cunningham et al. |
| 6,011,689 A | 1/2000 | Wrycraft |
| 6,031,717 A | 2/2000 | Baddour et al. |
| 6,034,870 A | 3/2000 | Osborn et al. |
| 6,042,348 A | 3/2000 | Aakalu et al. |
| 6,045,113 A | 4/2000 | Itakura |
| 6,055,814 A | 5/2000 | Song |
| 6,066,822 A | 5/2000 | Nemoto et al. |
| 6,067,225 A | 5/2000 | Reznikov et al. |
| 6,069,792 A | 5/2000 | Nelik |
| 6,084,768 A | 7/2000 | Bolognia |
| 6,094,342 A | 7/2000 | Dague et al. |
| 6,104,607 A | 8/2000 | Behl |
| 6,107,813 A | 8/2000 | Sinsheimer et al. |
| 6,115,250 A | 9/2000 | Schmitt |
| 6,122,131 A | 9/2000 | Jeppson |
| 6,122,232 A | 9/2000 | Schell et al. |

(56) References Cited

U.S. PATENT DOCUMENTS

| | | |
|---|---|---|
| 6,124,707 A | 9/2000 | Kim et al. |
| 6,129,428 A | 10/2000 | Helwig et al. |
| 6,130,817 A | 10/2000 | Flotho et al. |
| 6,144,553 A | 11/2000 | Hileman et al. |
| 6,166,901 A | 12/2000 | Gamble et al. |
| 6,169,413 B1 | 1/2001 | Paek et al. |
| 6,169,930 B1 | 1/2001 | Blachek et al. |
| 6,177,805 B1 | 1/2001 | Pih |
| 6,178,835 B1 | 1/2001 | Orriss et al. |
| 6,181,557 B1 | 1/2001 | Gatti |
| 6,185,065 B1 | 2/2001 | Hasegawa et al. |
| 6,185,097 B1 | 2/2001 | Behl |
| 6,188,191 B1 | 2/2001 | Frees et al. |
| 6,192,282 B1 | 2/2001 | Smith et al. |
| 6,193,339 B1 | 2/2001 | Behl et al. |
| 6,209,842 B1 | 4/2001 | Anderson et al. |
| 6,227,516 B1 | 5/2001 | Webster, Jr. et al. |
| 6,229,275 B1 | 5/2001 | Yamamoto |
| 6,231,145 B1 | 5/2001 | Liu |
| 6,233,148 B1 | 5/2001 | Shen |
| 6,236,563 B1 | 5/2001 | Buican et al. |
| 6,247,944 B1 | 6/2001 | Bolognia et al. |
| 6,249,824 B1 | 6/2001 | Henrichs |
| 6,252,769 B1 | 6/2001 | Tullstedt et al. |
| 6,262,581 B1 | 7/2001 | Han |
| 6,262,863 B1 | 7/2001 | Ostwald et al. |
| 6,272,007 B1 | 8/2001 | Kitlas et al. |
| 6,272,767 B1 | 8/2001 | Botruff et al. |
| 6,281,677 B1 | 8/2001 | Cosci et al. |
| 6,282,501 B1 | 8/2001 | Assouad |
| 6,285,524 B1 | 9/2001 | Boigenzahn et al. |
| 6,289,678 B1 | 9/2001 | Pandolfi |
| 6,297,950 B1 | 10/2001 | Erwin |
| 6,298,672 B1 | 10/2001 | Valicoff, Jr. |
| 6,302,714 B1 | 10/2001 | Bolognia et al. |
| 6,304,839 B1 | 10/2001 | Ho et al. |
| 6,307,386 B1 | 10/2001 | Fowler et al. |
| 6,327,150 B1 | 12/2001 | Levy et al. |
| 6,330,154 B1 | 12/2001 | Fryers et al. |
| 6,351,379 B1 | 2/2002 | Cheng |
| 6,354,792 B1 | 3/2002 | Kobayashi et al. |
| 6,356,409 B1 | 3/2002 | Price et al. |
| 6,356,415 B1 | 3/2002 | Kabasawa |
| 6,384,995 B1 | 5/2002 | Smith |
| 6,388,437 B1 | 5/2002 | Wolski et al. |
| 6,388,875 B1 | 5/2002 | Chen |
| 6,388,878 B1 | 5/2002 | Chang |
| 6,389,225 B1 | 5/2002 | Malinoski et al. |
| 6,390,756 B1 | 5/2002 | Isaacs et al. |
| 6,411,584 B2 | 6/2002 | Davis et al. |
| 6,421,236 B1 | 7/2002 | Montoya et al. |
| 6,434,000 B1 | 8/2002 | Pandolfi |
| 6,434,498 B1 | 8/2002 | Ulrich et al. |
| 6,434,499 B1 | 8/2002 | Ulrich et al. |
| 6,464,080 B1 | 10/2002 | Morris et al. |
| 6,467,153 B2 | 10/2002 | Butts et al. |
| 6,473,297 B1 | 10/2002 | Behl et al. |
| 6,473,301 B1 | 10/2002 | Levy et al. |
| 6,476,627 B1 | 11/2002 | Pelissier et al. |
| 6,477,044 B2 | 11/2002 | Foley et al. |
| 6,477,442 B1 | 11/2002 | Valerino, Sr. |
| 6,480,380 B1 | 11/2002 | French et al. |
| 6,480,382 B2 | 11/2002 | Cheng |
| 6,487,071 B1 | 11/2002 | Tata et al. |
| 6,489,793 B2 | 12/2002 | Jones et al. |
| 6,494,663 B2 | 12/2002 | Ostwald et al. |
| 6,525,933 B2 | 2/2003 | Eland |
| 6,526,841 B1 | 3/2003 | Wanek et al. |
| 6,535,384 B2 | 3/2003 | Huang |
| 6,537,013 B2 | 3/2003 | Emberty et al. |
| 6,544,309 B1 | 4/2003 | Hoefer et al. |
| 6,546,445 B1 | 4/2003 | Hayes |
| 6,553,532 B1 | 4/2003 | Aoki |
| 6,560,107 B1 | 5/2003 | Beck et al. |
| 6,565,163 B2 | 5/2003 | Behl et al. |
| 6,566,859 B2 | 5/2003 | Wolski et al. |
| 6,567,266 B2 | 5/2003 | Ives et al. |
| 6,568,770 B2 | 5/2003 | Gonska et al. |
| 6,570,734 B2 | 5/2003 | Ostwald et al. |
| 6,577,586 B1 | 6/2003 | Yang et al. |
| 6,577,687 B2 | 6/2003 | Hall et al. |
| 6,618,254 B2 | 9/2003 | Ives |
| 6,626,846 B2 | 9/2003 | Spencer |
| 6,628,518 B2 | 9/2003 | Behl et al. |
| 6,635,115 B1 | 10/2003 | Fairbairn et al. |
| 6,640,235 B1 | 10/2003 | Anderson |
| 6,644,982 B1 | 11/2003 | Ondricek et al. |
| 6,651,192 B1 | 11/2003 | Viglione et al. |
| 6,654,240 B1 | 11/2003 | Tseng et al. |
| 6,679,128 B2 | 1/2004 | Wanek et al. |
| 6,693,757 B2 | 2/2004 | Hayakawa et al. |
| 6,736,583 B2 | 5/2004 | Ostwald et al. |
| 6,741,529 B1 | 5/2004 | Getreuer |
| 6,746,648 B1 | 6/2004 | Mattila et al. |
| 6,751,093 B1 | 6/2004 | Hsu et al. |
| 6,791,785 B1 | 9/2004 | Messenger et al. |
| 6,791,799 B2 | 9/2004 | Fletcher |
| 6,798,651 B2 | 9/2004 | Syring et al. |
| 6,798,972 B1 | 9/2004 | Ito et al. |
| 6,801,834 B1 | 10/2004 | Konshak et al. |
| 6,806,700 B2 | 10/2004 | Wanek et al. |
| 6,808,353 B2 | 10/2004 | Ostwald et al. |
| 6,811,427 B2 | 11/2004 | Garrett et al. |
| 6,826,046 B1 | 11/2004 | Muncaster et al. |
| 6,830,372 B2 | 12/2004 | Liu et al. |
| 6,832,929 B2 | 12/2004 | Garrett et al. |
| 6,861,861 B2 | 3/2005 | Song et al. |
| 6,862,173 B1 | 3/2005 | Konshak et al. |
| 6,867,939 B2 | 3/2005 | Katahara et al. |
| 6,892,328 B2 | 5/2005 | Klein et al. |
| 6,904,479 B2 | 6/2005 | Hall et al. |
| 6,908,330 B2 | 6/2005 | Garrett et al. |
| 6,928,336 B2 | 8/2005 | Peshkin et al. |
| 6,937,432 B2 | 8/2005 | Sri-Jayantha et al. |
| 6,957,291 B2 | 10/2005 | Moon et al. |
| 6,965,811 B2 | 11/2005 | Dickey et al. |
| 6,974,017 B2 | 12/2005 | Oseguera |
| 6,976,190 B1 | 12/2005 | Goldstone |
| 6,980,381 B2 | 12/2005 | Gray et al. |
| 6,982,872 B2 | 1/2006 | Behl et al. |
| 7,006,325 B2 | 2/2006 | Emberty et al. |
| 7,013,198 B2 | 3/2006 | Haas |
| 7,021,883 B1 | 4/2006 | Plutt et al. |
| 7,039,924 B2 | 5/2006 | Goodman et al. |
| 7,054,150 B2 | 5/2006 | Orriss et al. |
| 7,070,323 B2 | 7/2006 | Wanek et al. |
| 7,076,391 B1 | 7/2006 | Pakzad et al. |
| 7,077,614 B1 | 7/2006 | Hasper et al. |
| 7,088,541 B2 | 8/2006 | Orriss et al. |
| 7,092,251 B1 | 8/2006 | Henry |
| 7,106,582 B2 | 9/2006 | Albrecht et al. |
| 7,123,477 B2 | 10/2006 | Coglitore et al. |
| 7,126,777 B2 | 10/2006 | Flechsig et al. |
| 7,130,138 B2 | 10/2006 | Lum et al. |
| 7,134,553 B2 | 11/2006 | Stephens |
| 7,139,145 B1 | 11/2006 | Archibald et al. |
| 7,164,579 B2 | 1/2007 | Muncaster et al. |
| 7,167,360 B2 | 1/2007 | Inoue et al. |
| 7,181,458 B1 | 2/2007 | Higashi |
| 7,203,021 B1 | 4/2007 | Ryan et al. |
| 7,203,060 B2 | 4/2007 | Kay et al. |
| 7,206,201 B2 | 4/2007 | Behl et al. |
| 7,216,968 B2 | 5/2007 | Smith et al. |
| 7,219,028 B2 | 5/2007 | Bae et al. |
| 7,219,273 B2 | 5/2007 | Fisher et al. |
| 7,227,746 B2 | 6/2007 | Tanaka et al. |
| 7,232,101 B2 | 6/2007 | Wanek et al. |
| 7,243,043 B2 | 7/2007 | Shin |
| 7,248,467 B2 | 7/2007 | Sri-Jayantha et al. |
| 7,259,966 B2 | 8/2007 | Connelly, Jr. et al. |
| 7,273,344 B2 | 9/2007 | Ostwald et al. |
| 7,280,353 B2 | 10/2007 | Wendel et al. |
| 7,289,885 B2 | 10/2007 | Basham et al. |
| 7,304,855 B1 | 12/2007 | Milligan et al. |

(56) References Cited

U.S. PATENT DOCUMENTS

| | | |
|---|---|---|
| 7,315,447 B2 | 1/2008 | Inoue et al. |
| 7,349,205 B2 | 3/2008 | Hall et al. |
| 7,353,524 B1 | 4/2008 | Lin et al. |
| 7,385,385 B2 | 6/2008 | Magliocco et al. |
| 7,395,133 B2 | 7/2008 | Lowe |
| 7,403,451 B2 | 7/2008 | Goodman et al. |
| 7,421,623 B2 | 9/2008 | Haugh |
| 7,437,212 B2 | 10/2008 | Farchmin et al. |
| 7,447,011 B2 | 11/2008 | Wade et al. |
| 7,457,112 B2 | 11/2008 | Fukuda et al. |
| 7,467,024 B2 | 12/2008 | Flitsch |
| 7,476,362 B2 | 1/2009 | Angros |
| 7,483,269 B1 | 1/2009 | Marvin, Jr. et al. |
| 7,505,264 B2 | 3/2009 | Hall et al. |
| 7,554,811 B2 | 6/2009 | Scicluna et al. |
| 7,568,122 B2 | 7/2009 | Mechalke et al. |
| 7,570,455 B2 | 8/2009 | Deguchi et al. |
| 7,573,715 B2 | 8/2009 | Mojaver et al. |
| 7,584,851 B2 | 9/2009 | Hong et al. |
| 7,612,996 B2 | 11/2009 | Atkins et al. |
| 7,625,027 B2 | 12/2009 | Kiaie et al. |
| 7,630,196 B2 | 12/2009 | Hall et al. |
| 7,635,246 B2 | 12/2009 | Neeper et al. |
| 7,643,289 B2 | 1/2010 | Ye et al. |
| 7,646,596 B2 | 1/2010 | Ng |
| 7,729,107 B2 | 6/2010 | Atkins et al. |
| 7,778,031 B1 | 8/2010 | Merrow et al. |
| 7,789,267 B2 | 9/2010 | Hutchinson et al. |
| 7,848,106 B2 | 12/2010 | Merrow |
| 7,890,207 B2 | 2/2011 | Toscano et al. |
| 7,904,211 B2 | 3/2011 | Merrow et al. |
| 7,908,029 B2 | 3/2011 | Slocum, III |
| 7,911,778 B2 | 3/2011 | Merrow |
| 7,920,380 B2 | 4/2011 | Merrow et al. |
| 7,929,303 B1 | 4/2011 | Merrow |
| 7,932,734 B2 | 4/2011 | Merrow et al. |
| 7,940,529 B2 | 5/2011 | Merrow et al. |
| 7,945,424 B2 | 5/2011 | Garcia et al. |
| 7,987,018 B2 | 7/2011 | Polyakov et al. |
| 7,995,349 B2 | 8/2011 | Merrow et al. |
| 7,996,174 B2 | 8/2011 | Garcia et al. |
| 8,041,449 B2 | 10/2011 | Noble et al. |
| 8,086,343 B2 | 12/2011 | Slocum, III |
| 8,095,234 B2 | 1/2012 | Polyakov et al. |
| 8,102,173 B2 | 1/2012 | Merrow |
| 8,116,079 B2 | 2/2012 | Merrow |
| 8,117,480 B2 | 2/2012 | Merrow et al. |
| 8,140,182 B2 | 3/2012 | Noble et al. |
| 8,160,739 B2 | 4/2012 | Toscano et al. |
| 8,238,099 B2 | 8/2012 | Merrow |
| 8,279,603 B2 | 10/2012 | Merrow et al. |
| 8,305,751 B2 | 11/2012 | Merrow |
| 8,405,971 B2 | 3/2013 | Merrow et al. |
| 8,466,699 B2 | 6/2013 | Merrow et al. |
| 8,467,180 B2 | 6/2013 | Merrow et al. |
| 8,482,915 B2 | 7/2013 | Merrow |
| 8,499,611 B2 | 8/2013 | Merrow et al. |
| 8,547,123 B2 | 10/2013 | Merrow et al. |
| 8,549,912 B2 | 10/2013 | Merrow et al. |
| 8,628,239 B2 | 1/2014 | Merrow et al. |
| 8,631,698 B2 | 1/2014 | Merrow et al. |
| 8,655,482 B2 | 2/2014 | Merrow |
| 8,687,349 B2 | 4/2014 | Truebenbach |
| 8,687,356 B2 | 4/2014 | Merrow |
| 9,196,518 B1 | 11/2015 | Hofmeister et al. |
| 9,459,312 B2 | 10/2016 | Arena et al. |
| 2001/0006453 A1 | 7/2001 | Glorioso et al. |
| 2001/0044023 A1 | 11/2001 | Johnson et al. |
| 2001/0046118 A1 | 11/2001 | Yamanashi et al. |
| 2001/0048590 A1 | 12/2001 | Behl et al. |
| 2002/0009391 A1 | 1/2002 | Marquiss et al. |
| 2002/0026258 A1 | 2/2002 | Suzuki et al. |
| 2002/0030981 A1 | 3/2002 | Sullivan et al. |
| 2002/0044416 A1 | 4/2002 | Harmon et al. |
| 2002/0051338 A1 | 5/2002 | Jiang et al. |
| 2002/0071248 A1 | 6/2002 | Huang et al. |
| 2002/0079422 A1 | 6/2002 | Jiang |
| 2002/0090320 A1 | 7/2002 | Burow et al. |
| 2002/0116087 A1 | 8/2002 | Brown |
| 2002/0161971 A1 | 10/2002 | Dimitri et al. |
| 2002/0172004 A1 | 11/2002 | Ives et al. |
| 2003/0035271 A1 | 2/2003 | Lelong et al. |
| 2003/0043550 A1 | 3/2003 | Ives |
| 2003/0206397 A1 | 11/2003 | Allgeyer et al. |
| 2004/0165489 A1 | 8/2004 | Goodman et al. |
| 2004/0207387 A1 | 10/2004 | Chung et al. |
| 2004/0230399 A1 | 11/2004 | Shin |
| 2004/0236465 A1 | 11/2004 | Butka et al. |
| 2004/0251866 A1 | 12/2004 | Gan et al. |
| 2004/0264121 A1 | 12/2004 | Orriss et al. |
| 2005/0004703 A1 | 1/2005 | Christie |
| 2005/0010836 A1 | 1/2005 | Bae et al. |
| 2005/0018397 A1 | 1/2005 | Kay et al. |
| 2005/0055601 A1 | 3/2005 | Wilson et al. |
| 2005/0057849 A1 | 3/2005 | Twogood et al. |
| 2005/0069400 A1 | 3/2005 | Dickey et al. |
| 2005/0109131 A1 | 5/2005 | Wanek et al. |
| 2005/0116702 A1 | 6/2005 | Wanek et al. |
| 2005/0131578 A1 | 6/2005 | Weaver |
| 2005/0179457 A1 | 8/2005 | Min et al. |
| 2005/0207059 A1 | 9/2005 | Cochrane |
| 2005/0219809 A1 | 10/2005 | Muncaster et al. |
| 2005/0225338 A1 | 10/2005 | Sands et al. |
| 2005/0270737 A1 | 12/2005 | Wilson et al. |
| 2006/0010353 A1 | 1/2006 | Haugh |
| 2006/0023331 A1 | 2/2006 | Flechsig et al. |
| 2006/0028802 A1 | 2/2006 | Shaw et al. |
| 2006/0035563 A1 | 2/2006 | Kalenian et al. |
| 2006/0066974 A1 | 3/2006 | Akamatsu et al. |
| 2006/0130316 A1 | 6/2006 | Takase et al. |
| 2006/0190205 A1 | 8/2006 | Klein et al. |
| 2006/0227517 A1 | 10/2006 | Zayas et al. |
| 2006/0250766 A1 | 11/2006 | Blaalid et al. |
| 2007/0034368 A1 | 2/2007 | Atkins et al. |
| 2007/0035874 A1 | 2/2007 | Wendel et al. |
| 2007/0035875 A1 | 2/2007 | Hall et al. |
| 2007/0053154 A1 | 3/2007 | Fukuda et al. |
| 2007/0082907 A1 | 4/2007 | Canada et al. |
| 2007/0127202 A1 | 6/2007 | Scicluna et al. |
| 2007/0127206 A1 | 6/2007 | Wade et al. |
| 2007/0183871 A1 | 8/2007 | Hofmeister et al. |
| 2007/0195497 A1 | 8/2007 | Atkins |
| 2007/0248142 A1 | 10/2007 | Rountree et al. |
| 2007/0253157 A1 | 11/2007 | Atkins et al. |
| 2007/0286045 A1 | 12/2007 | Onagi et al. |
| 2008/0007865 A1 | 1/2008 | Orriss et al. |
| 2008/0030945 A1 | 2/2008 | Mojaver et al. |
| 2008/0112075 A1 | 5/2008 | Farquhar et al. |
| 2008/0239564 A1 | 10/2008 | Farquhar et al. |
| 2008/0282275 A1 | 11/2008 | Zaczek et al. |
| 2008/0282278 A1 | 11/2008 | Barkley |
| 2008/0317575 A1 | 12/2008 | Yamazaki et al. |
| 2009/0028669 A1 | 1/2009 | Rebstock |
| 2009/0082907 A1 | 3/2009 | Stuvel et al. |
| 2009/0122443 A1 | 5/2009 | Farquhar et al. |
| 2009/0142169 A1 | 6/2009 | Garcia et al. |
| 2009/0153992 A1 | 6/2009 | Garcia et al. |
| 2009/0153993 A1 | 6/2009 | Garcia et al. |
| 2009/0153994 A1 | 6/2009 | Merrow et al. |
| 2009/0175705 A1 | 7/2009 | Nakao et al. |
| 2009/0261047 A1 | 10/2009 | Merrow |
| 2009/0261228 A1 | 10/2009 | Merrow |
| 2009/0261229 A1 | 10/2009 | Merrow |
| 2009/0262444 A1 | 10/2009 | Polyakov et al. |
| 2009/0262445 A1 | 10/2009 | Noble et al. |
| 2009/0262454 A1 | 10/2009 | Merrow |
| 2009/0262455 A1 | 10/2009 | Merrow |
| 2009/0265032 A1 | 10/2009 | Toscano et al. |
| 2009/0265043 A1 | 10/2009 | Merrow et al. |
| 2009/0265136 A1 | 10/2009 | Garcia et al. |
| 2009/0297328 A1 | 12/2009 | Slocum, III |
| 2010/0074404 A1 | 3/2010 | Ito |
| 2010/0083732 A1 | 4/2010 | Merrow et al. |
| 2010/0165498 A1 | 7/2010 | Merrow et al. |

(56) References Cited

U.S. PATENT DOCUMENTS

| | | |
|---|---|---|
| 2010/0165501 A1 | 7/2010 | Polyakov et al. |
| 2010/0168906 A1 | 7/2010 | Toscano et al. |
| 2010/0172722 A1 | 7/2010 | Noble et al. |
| 2010/0193661 A1 | 8/2010 | Merrow |
| 2010/0194253 A1 | 8/2010 | Merrow et al. |
| 2010/0195236 A1 | 8/2010 | Merrow et al. |
| 2010/0220183 A1 | 9/2010 | Yoro et al. |
| 2010/0230885 A1 | 9/2010 | Di Stefano |
| 2010/0249993 A1 | 9/2010 | Mitsuyoshi |
| 2010/0265609 A1 | 10/2010 | Merrow et al. |
| 2010/0265610 A1 | 10/2010 | Merrow et al. |
| 2010/0279439 A1 | 11/2010 | Shah et al. |
| 2010/0302678 A1 | 12/2010 | Merrow |
| 2011/0011844 A1 | 1/2011 | Merrow et al. |
| 2011/0012631 A1 | 1/2011 | Merrow et al. |
| 2011/0012632 A1 | 1/2011 | Merrow et al. |
| 2011/0013362 A1 | 1/2011 | Merrow et al. |
| 2011/0013665 A1 | 1/2011 | Merrow et al. |
| 2011/0013666 A1 | 1/2011 | Merrow et al. |
| 2011/0013667 A1 | 1/2011 | Merrow et al. |
| 2011/0064546 A1 | 3/2011 | Merrow |
| 2011/0074458 A1 | 3/2011 | Di Stefano et al. |
| 2011/0157825 A1 | 6/2011 | Merrow et al. |
| 2011/0172807 A1 | 7/2011 | Merrow |
| 2011/0185811 A1 | 8/2011 | Merrow et al. |
| 2011/0189934 A1 | 8/2011 | Merrow |
| 2011/0236163 A1 | 9/2011 | Smith et al. |
| 2011/0261483 A1 | 10/2011 | Campbell et al. |
| 2011/0305132 A1 | 12/2011 | Merrow et al. |
| 2011/0310724 A1 | 12/2011 | Martino |
| 2012/0023370 A1 | 1/2012 | Truebenbach |
| 2012/0034054 A1 | 2/2012 | Polyakov et al. |
| 2012/0050903 A1 | 3/2012 | Campbell et al. |
| 2012/0106351 A1 | 5/2012 | Gohel et al. |
| 2012/0321435 A1 | 12/2012 | Truebenbach |
| 2013/0071224 A1 | 3/2013 | Merrow et al. |
| 2013/0108253 A1 | 5/2013 | Akers et al. |
| 2013/0181576 A1 | 7/2013 | Shiozawa et al. |
| 2013/0200915 A1 | 8/2013 | Panagas |
| 2013/0256967 A1 | 10/2013 | Carvalho |
| 2013/0345836 A1 | 12/2013 | Ikushima |
| 2014/0002123 A1 | 1/2014 | Lee |
| 2014/0093214 A1 | 4/2014 | Detofsky et al. |
| 2014/0271064 A1* | 9/2014 | Merrow ............ G11B 33/128 414/280 |
| 2014/0306728 A1 | 10/2014 | Arena et al. |
| 2015/0127986 A1* | 5/2015 | Tahara ............ G06F 11/2273 714/33 |
| 2017/0059635 A1 | 3/2017 | Orchanian et al. |
| 2019/0064252 A1 | 2/2019 | Bowyer et al. |
| 2019/0064254 A1 | 2/2019 | Bowyer et al. |
| 2019/0064305 A1 | 2/2019 | Khalid |

FOREIGN PATENT DOCUMENTS

| | | |
|---|---|---|
| CN | 1177187 A | 3/1998 |
| CN | 1192544 A | 9/1998 |
| CN | 2341188 Y | 9/1999 |
| DE | 3786944 T2 | 11/1993 |
| DE | 69111634 T2 | 5/1996 |
| DE | 69400145 T2 | 10/1996 |
| DE | 19701548 A1 | 8/1997 |
| DE | 19804813 A1 | 9/1998 |
| DE | 69614460 T2 | 6/2002 |
| DE | 69626584 T2 | 12/2003 |
| DE | 19861388 B4 | 8/2007 |
| EP | 0210497 A2 | 2/1987 |
| EP | 0242970 A2 | 10/1987 |
| EP | 0 277 634 A2 | 8/1988 |
| EP | 0356977 A2 | 3/1990 |
| EP | 0442642 A2 | 8/1991 |
| EP | 0466073 A2 | 1/1992 |
| EP | 582017 A1 | 2/1994 |
| EP | 0617570 A1 | 9/1994 |
| EP | 0635836 A1 | 1/1995 |
| EP | 741508 A2 | 11/1996 |
| EP | 0757320 A2 | 2/1997 |
| EP | 0757351 A2 | 2/1997 |
| EP | 0776009 A2 | 5/1997 |
| EP | 0840476 A2 | 5/1998 |
| EP | 1 045 301 A2 | 10/2000 |
| EP | 1209557 A2 | 5/2002 |
| EP | 1234308 A1 | 8/2002 |
| EP | 1422713 A2 | 5/2004 |
| EP | 1612798 A1 | 1/2006 |
| EP | 1760722 A1 | 3/2007 |
| GB | 2241118 A | 8/1991 |
| GB | 2276275 A | 9/1994 |
| GB | 2299436 A | 10/1996 |
| GB | 2312984 A | 11/1997 |
| GB | 2328782 A | 3/1999 |
| GB | 2439844 A | 1/2008 |
| JP | 61-115279 | 6/1986 |
| JP | 62-177621 | 8/1987 |
| JP | 62-239394 | 10/1987 |
| JP | 62-251915 | 11/1987 |
| JP | 63-002160 | 1/1988 |
| JP | 63-016482 | 1/1988 |
| JP | 63-062057 | 3/1988 |
| JP | 63-201946 | 8/1988 |
| JP | 63-004483 | 9/1988 |
| JP | 63-214972 | 9/1988 |
| JP | 63-269376 | 11/1988 |
| JP | S63-195697 U | 12/1988 |
| JP | 64-089034 | 4/1989 |
| JP | 2-091565 | 3/1990 |
| JP | 2-098197 | 4/1990 |
| JP | 2-185784 | 7/1990 |
| JP | 2-199690 | 8/1990 |
| JP | 2-278375 | 11/1990 |
| JP | 2-297770 | 12/1990 |
| JP | 3-078160 B2 | 4/1991 |
| JP | 3-105704 B2 | 5/1991 |
| JP | H05-319520 A | 12/1993 |
| JP | 6-004220 | 1/1994 |
| JP | 6-004981 | 1/1994 |
| JP | 6-162645 | 6/1994 |
| JP | 6-181561 | 6/1994 |
| JP | 6-215515 | 8/1994 |
| JP | 6-274943 | 9/1994 |
| JP | 6-314173 | 11/1994 |
| JP | 7-007321 | 1/1995 |
| JP | 7-029364 | 1/1995 |
| JP | H07-010212 A | 1/1995 |
| JP | 7-037376 | 2/1995 |
| JP | 7-056654 | 3/1995 |
| JP | 7-111078 | 4/1995 |
| JP | 7-115497 | 5/1995 |
| JP | 7-201082 | 8/1995 |
| JP | 7-226023 | 8/1995 |
| JP | 7-230669 | 8/1995 |
| JP | 7-257525 | 10/1995 |
| JP | 1982246 | 10/1995 |
| JP | 7-307059 | 11/1995 |
| JP | 8007994 | 1/1996 |
| JP | 8-030398 | 2/1996 |
| JP | 8-030407 | 2/1996 |
| JP | 8-079672 | 3/1996 |
| JP | 8-106776 | 4/1996 |
| JP | 8-110821 | 4/1996 |
| JP | 8-167231 | 6/1996 |
| JP | 8-212015 | 8/1996 |
| JP | 8-244313 | 9/1996 |
| JP | 8-263525 | 10/1996 |
| JP | 8-263909 | 10/1996 |
| JP | 8-297957 | 11/1996 |
| JP | 2553315 B2 | 11/1996 |
| JP | 9-044445 | 2/1997 |
| JP | 9-064571 | 3/1997 |
| JP | 9-082081 | 3/1997 |
| JP | 2635127 B2 | 7/1997 |
| JP | 9-306094 | 11/1997 |
| JP | H09-319466 A | 12/1997 |

(56) References Cited

FOREIGN PATENT DOCUMENTS

| | | |
|---|---|---|
| JP | 10-040021 | 2/1998 |
| JP | 10-049365 | 2/1998 |
| JP | 10-064173 | 3/1998 |
| JP | 10-098521 | 4/1998 |
| JP | 2771297 B2 | 7/1998 |
| JP | 10-275137 | 10/1998 |
| JP | 10-281799 | 10/1998 |
| JP | 10-320128 | 12/1998 |
| JP | 10-340139 | 12/1998 |
| JP | 2862679 B2 | 3/1999 |
| JP | 11-134852 | 5/1999 |
| JP | 11-139839 | 5/1999 |
| JP | 2906930 B2 | 6/1999 |
| JP | 11-203201 | 7/1999 |
| JP | 11-213182 | 8/1999 |
| JP | 11-327800 | 11/1999 |
| JP | 11-353128 | 12/1999 |
| JP | 11-353129 | 12/1999 |
| JP | 3-008086 B2 | 2/2000 |
| JP | 2000-056935 A | 2/2000 |
| JP | 2000-066845 A | 3/2000 |
| JP | 2000-112831 A | 4/2000 |
| JP | 2000-113563 A | 4/2000 |
| JP | 2000-114759 A | 4/2000 |
| JP | 2000-125290 A | 4/2000 |
| JP | 2000-132704 A | 5/2000 |
| JP | 2000-149431 A | 5/2000 |
| JP | 3052183 B2 | 6/2000 |
| JP | 2000-228686 A | 8/2000 |
| JP | 2000-235762 A | 8/2000 |
| JP | 2000-236188 A | 8/2000 |
| JP | 2000-242598 A | 9/2000 |
| JP | 2000-278647 A | 10/2000 |
| JP | 3097994 B2 | 10/2000 |
| JP | 2000-305860 A | 11/2000 |
| JP | 2001-005501 A | 1/2001 |
| JP | 2001-023270 A | 1/2001 |
| JP | 2001-100925 A | 4/2001 |
| JP | 3-207947 B2 | 9/2001 |
| JP | 3-210662 B2 | 9/2001 |
| JP | 3-212859 B2 | 9/2001 |
| JP | 3-214490 B2 | 10/2001 |
| JP | 3-240821 B2 | 12/2001 |
| JP | 2002-42446 | 2/2002 |
| JP | 3-295071 B2 | 6/2002 |
| JP | 2007087498 A | 4/2007 |
| JP | 2007-188615 A | 7/2007 |
| JP | 2007-220184 A | 8/2007 |
| JP | 2007-293936 A | 11/2007 |
| JP | 2007-305206 A | 11/2007 |
| JP | 2007-305290 A | 11/2007 |
| JP | 4-017134 B2 | 12/2007 |
| JP | 2007-328761 A | 12/2007 |
| JP | 2008-503824 A | 2/2008 |
| JP | 4-143989 B2 | 9/2008 |
| JP | 4-172658 B2 | 10/2008 |
| JP | 4-214288 B2 | 1/2009 |
| JP | 4-247385 B2 | 4/2009 |
| JP | 4-259956 B2 | 4/2009 |
| JP | 4-307440 B2 | 8/2009 |
| JP | 4-325923 B2 | 9/2009 |
| JP | 5-035053 B2 | 9/2012 |
| JP | 5-035415 B2 | 9/2012 |
| JP | 5-066896 B2 | 11/2012 |
| JP | 5-068257 B2 | 11/2012 |
| JP | 5-073566 B2 | 11/2012 |
| JP | 5-073803 B2 | 11/2012 |
| JP | 5-101603 B2 | 12/2012 |
| JP | 5-173718 B2 | 4/2013 |
| JP | 5-189163 B2 | 4/2013 |
| JP | 5-204725 B2 | 6/2013 |
| JP | 5-223551 B2 | 6/2013 |
| KR | 1998-0035445 A | 8/1998 |
| KR | 10-0176527 | 11/1998 |
| KR | 10-0214308 B1 | 8/1999 |
| KR | 10-0403039 B1 | 10/2003 |
| SG | 45223 A1 | 1/1998 |
| TW | 387574 U | 4/2000 |
| WO | WO-89/01682 A1 | 2/1989 |
| WO | WO-97/06532 A1 | 2/1997 |
| WO | WO-00/49487 A1 | 8/2000 |
| WO | WO-00/67253 A1 | 11/2000 |
| WO | WO-01/09627 A2 | 2/2001 |
| WO | WO-01/41148 A1 | 6/2001 |
| WO | WO-03/013783 A1 | 2/2003 |
| WO | WO-03/021597 A1 | 3/2003 |
| WO | WO-03/021598 A1 | 3/2003 |
| WO | WO-03/067385 A2 | 8/2003 |
| WO | WO-2004/006260 A1 | 1/2004 |
| WO | WO-2004/114286 A1 | 12/2004 |
| WO | WO-2005/024830 A1 | 3/2005 |
| WO | WO-2005/024831 A1 | 3/2005 |
| WO | WO-2005/109131 A1 | 11/2005 |
| WO | WO-2006/030185 A1 | 3/2006 |
| WO | WO-2006/048611 A1 | 5/2006 |
| WO | WO-2006/100441 A1 | 9/2006 |
| WO | WO-2006/100445 A1 | 9/2006 |
| WO | WO-2007/031729 A1 | 3/2007 |

OTHER PUBLICATIONS

Written Opinion for PCT/US2019/38909, 8 pages (dated Oct. 11, 2019).

Abraham et al., "Thermal Proximity Imaging of Hard-Disk Substrates", IEEE Transactions on Mathematics 36:3997-4004, Nov. 2000.

Abramovitch, "Rejecting Rotational Disturbances on Small Disk Drives Using Rotational Accelerometers", Proceedings of the 1996 IFAC World Congress in San Francisco, CA, 8 pages (Jul. 1996).

Ali et al., "Modeling and Simulation of Hard Disk Drive Final Assembly Using a HDD Template" Proceedings of the 2007 Winter Simulation Conference, IEEE pp. 1641-1650 (2007).

Anderson et al., "Clinical chemistry: concepts and applications", The McGraw-Hill Companies, Inc., pp. 131-132, 2003.

Anderson et al., "High Reliability Variable Load Time Controllable Vibration Free Thermal Processing Environment", Delphion, 3 pages (Dec. 1993). https://www.delphion.com/tdbs/tdb?order=93A +63418 (retrieved Mar. 18, 2009).

Asbrand, "Engineers at One Company Share the Pride and the Profits of Successful Product Design ", Professional Issues, 4 pages, 1987.

Bair et al., "Measurements of Asperity Temperatures of a Read/Write Head Slider Bearing in Hard Magnetic Recording Disks", Journal of Tribology 113:547-554, Jul. 1991.

Bakken et al., "Low Cost, Rack Mounted, Direct Access Disk Storage Device", Delphion, 2 pages (Mar. 1977). http://www.delphion.com/tdbs/tdb (retrieved Mar. 3, 2005).

Biber et al., "Disk Drive Drawer Thermal Management", Advances in Electronic Packaging vol. 1:43-46, 1995.

Christensen, "How Can Great firms Fail? Insights from the hard Disk Drive Industry", Harvard Business School Press, pp. 1-26, 2006.

Chung et al., "Vibration Absorber for Reduction of the In-plane Vibration in an Optical Disk Drive", IEEE Transactions on Consumer Electronics, Vo. 48, May 2004.

Curtis et al., "InPhase Professional Archive Drive Architecture", InPhase Technologies, Inc., 6 pages (Dec. 17, 2007) http://www.science.edu/TechoftheYear/Nominees/InPhase.

Exhibit 1 in *Xyratex Technology, Ltd v. Teradyne, Inc.;* Newspaper picture that displays the CSO tester; 1990.

Exhibit 1314 in *Xyratex Technology, Ltd. V. Teradyne, Inc.;* Case, "Last products of Disk-File Development at Hursley and Millbrook," IBM, Oct. 12, 1990.

Exhibit 1315 in *Xyratex Technology, Ltd. V. Teradyne, Inc.;* Case, "History of Disk-File Development at Hursley and Millbrook," IBM, Oct. 17, 1990.

Exhibit 1326 in *Xyratex Technology, Ltd v. Teradyne, Inc.;* Image of the back of Exhibit 1 and Exhibit 2 photos, which display the photos dates; 1990.

(56) References Cited

OTHER PUBLICATIONS

Exhibit 2 in *Xyratex Technology, Ltd v. Teradyne, Inc.;* Photos of the CSO tester obtained from Hitachi; 1990.
Findeis et al., "Vibration Isolation Techniques Suitable for Portable Electronic Speckle Pattern Interferometry", Proc. SPIE vol. 4704, pp. 159-167, 2002 http://www.ndt.uct.ac.za/Paoers/soiendt2002.odf.
FlexStar Technology, "FlexStar's Family of Products," http://www.flexstar.com, 1 page (1999).
FlexStar Technology, "A World of Storage Testing Solutions," http://www.flexstar.com, 1 page (1999).
FlexStar Technology, "Environment Chamber Products," http://www.flexstar.com, 1 page. (1999).
FlexStar Technology, 30E/Cascade Users Manual, Doc #98-36387-00 Rev. 1.8, pp. 1-33, Jun. 1, 2004.
Frankovich, "The Basics of Vibration Isolation Using Elastomeric Materials", Aearo EAR Specialty Composites, 8 pages (2005) http://www.isoloss.com/11dfs/engineering/BasicsoNibrationisolation.
Grochowski et al., "Future Trends in Hard Disk Drives", IEEE Transactions on Magnetics, 32(3): 1850-1854 (May 1996).
Gurumurthi et al., "Disk Drive Roadmap from the Thermal Perspective: A Case for Dynamic Thermal Management", International Symposium on Computer Architecture Proceedings of the 32nd Annual International Symposium on Computer Architecture, Technical Report CSE-05-001, pp. 38-49 (Feb. 2005).
Gurumurthi et al., "Thermal Issues in Disk Drive Design: Challenges and Possible Solutions", ACM Transactions on Storage, 2(1): 41-73 (Feb. 2006).
Gurumurthi, "The Need for temperature-Aware Storage Systems", The Tenth Intersociety conference on Thermal and Thermomechanical Phenomena in Electronics, pp. 387-394, 2006.
Haddad et al., "A new Mounting Adapter for Computer Peripherals with Improved Reliability, Thermal Distribution, Low Noise and Vibration Reduction", ISPS, Advances in Information Storage and Processing Systems, 1:97-108, 1995.
Henderson, "Had High Aerial Densities Require Solid Test Fixtures", Flexstar Technology, 3 pages (Feb. 26, 2007).
HighBeam Research website "ACT debuts six-zone catalytic gas heater. (American Catalytic Technologies offers new heaters)", 4 pages (Oct. 26, 1998). http://www.highbeam.com.
HighBeam Research website "Asynchronous Testing Increases Throughput", 7 pages (Dec. 1, 2000). http://www.highbeam.com.
HighBeam Research website "Credence announces Production Release of the EPRO AQ Series for Integrated Test and Back-end Processing", 4 pages (1995). http://www.highbeam.com.
HighBeam Research website "Test Multiple Parts At Once for Air Leaks. (Brief Article)", 1 page (1999) http://www.highbeam.com.
Iwamiya, "Hard Drive Cooling Using a Thermoelectric Cooler", EEP—vol. 19-2, Advances in Electronic Packaging, vol. 2:2203-2208, ASME 1997.
Johnson et al., "Performance Measurements of Tertiary Storage Devices", Proceedings of the 24th VLDB Conference, New York, pp. 50-61, 1998.
Ku, "Investigation of Hydrodynamic Bearing Friction in Data Storage information System Spindle Motors", ISPS vol. 1, Advances in Information Storage and Processing Systems, pp. 159-165, ASME 1995.
Lindner, "Disk drive mounting", IBM Technical Disclosure Brochure, vol. 16, No. 3, pp. 903-904, Aug. 1973.
McAuley, "Recursive Time Trapping for Synchronization of Product and CHAMBER Profiles for Stress Test", Delphion, 3 pages (Jun. 1988), https://www.delphion.com/tdbs/tdb (retrieved Mar. 18, 2009).
Morgenstern, Micropolis Drives Target High-end Apps; Technology Provides Higher Uninterrupted Data Transfer. (Applications; Microdisk AV LS 3020 and 1050AV and I 760AV LT Stackable Hard Drive Systems) (Product Announcement) MacWeek, vol. 8, No. 6, p. 8; Feb. 7, 1994.
Morris, "Zero Cost Power and Cooling Monitor System", 3 pages (Jun. 1994) https://www.delphion.com/tdbs/tdb (retrieved Jan. 15, 2008).
Nagarajan, "Survey of Cleaning and cleanliness Measurement in Disk Drive Manufacture", North Carolina Department of Environment and Natural Resources, 13-21 (Feb. 1997).
Park, "Vibration and Noise Reduction of an Optical Disk Drive by Using a Vibration Absorber Methods and Apparatus for Securing Disk Drives in a Disk", IEEE Transactions on Consumer Electronics, vol. 48, Nov. 2002.
Prater et al., "Thermal and Heat-Flow Aspects of Actuators for Hard Disk Drives", InterSociety Conference on Thermal Phenomena, pp. 261-268, 1994.
Ruwart et al., "Performance Impact of External Vibration on Consumer-grade and enterprise-class Disk Drives", Proceedings of the 22nd IEEE/13th Goddard Conference on Mass Storage Systems and Technologies, 2005.
Schroeder et al., "Disk Failures in the Real World: What does an MTTP of 1,000,000 hours mean to you?", In FAST'07: 5th USENIX Conference on File and Storage Technologies, San Jose, CA, Feb. 14-16, 2007.
Schulze et al., "How Reliable is a Raid?," COMPCON Spring apos; 89. Thirty-Fouth IEEE Computer Society International Conference: Intellectual Leverage, Digest of papers; pp. 118-123, Feb. 27-Mar. 3, 1989.
Seagate Product Marketing, "Seagate's Advanced Multidrive System (SAMS) Rotational Vibration Feature", Publication TP-229D, Feb. 2000.
Suwa et al., "Evaluation System for Residual Vibration from HDD Mounting Mechanism" IEEE Transactions on Magnetics, vol. 35, No. 2, pp. 868-873, Mar. 1999.
Suwa et al., "Rotational Vibration Suppressor" IBM Technical Disclosure Bulletin Oct. 1991.
Terwiesch et al., "An Exploratory Study of International Product Transfer and Production Ramp-Up in the Data Storage Industry", The Information Storage Industry Center, University of California, pp. 1-31, 1999. www-iros.ucsd.edu/sloan/.
Tzeng, "Dynamic Torque Characteristics of Disk-Drive Spindle Bearings", ISPS—vol. 1, Advances in Information Storage and Processing Systems, pp. 57-63, ASME 1995.
Tzeng, "Measurements of Transient Thermal Strains in a Disk-Drive Actuator", InterSociety conference on Thermal Phenomena, pp. 269-274, 1994.
Wilson—7000 disk Drive Analyzer Product Literature, date accessed Jan. 28, 2009, 2 pages.
Winchester, "Automation Specialists Use Machine Vision as a System Development Tool", IEE Computing & Control Engineering, Jun./Jul. 2003.
Xyratex Product Test brochure, "Automated Production Test Solutions", 2006.
*Xyratex Technology, Ltd. V. Teradyne, Inc.,* Amended Joint Trial Exhibit List of Xyratex and Teradyne. Case No. CV 08-04545 SJO (PLAx), Nov. 12, 2009.
*Xyratex Technology, Ltd. V. Teradyne, Inc.,* Teradyne, Inc's Prior Art Notice Pursuant to 35; U.S.C. Section 282. Case No. CV 08-04545 SJO (PLAx), Oct. 16, 2009.
Xyratex to Debut its New Automated Test Solution for 2.5-Inch Disk Drives at DISKCON USA 2004, PR Newswire Europe (2004).
Xyratex, "Continuous Innovation—Production Test Systems".
Xyratex, "Key Advantages—Production Test Systems" www.xyratex.com/Products/production-test-system (1995-2008).
Xyratex, "Process Challenges in the Hard Drive Industry" slide presentation, Asian Diskcon (2006).
Xyratex, "Production Test Systems" www.xyratex.com/Products/production-test-system (1995-2008).
Xyratex, "Single cell—Production Test Systems" www.xyratex.com/Products/production-test-system (1995-2008).
Xyratex, "Storage Infrastructure" www.xyratex.com/Products/storage-infrastructure/default.aspx (1995-2008).
Xyratex, "Testing Drives Colder—Production Test Systems" www.xyratex.com/Products/production-test-system (1995-2008).
Low, Y.L. et al., "Thermal network model for temperature prediction in hard disk drive", Microsyst Technol, 15: 1653-1656 (2009).

(56) References Cited

OTHER PUBLICATIONS

Final Office Action for U.S. Appl. No. 15/688,048 (50 pages) dated Feb. 18, 2020.
Non-Final Office Action for U.S. Appl. No. 15/688,048 (50 pages) dated Jun. 12, 2020.
Final Office Action for U.S. Appl. No. 15/688,104 (45 pages) dated Mar. 4, 2020.
Final Office Action for U.S. Appl. No. 15/688,112 (43 pages) dated Dec. 11, 2019.
Non-Final Office Action for U.S. Appl. No. 15/688,112 (66 pages) dated Mar. 5, 2020.

* cited by examiner

SYSTEM FOR TESTING DEVICES INSIDE OF CARRIERS

TECHNICAL FIELD

This specification relates generally to a test system having test carriers that include electronics for testing devices inside the test carriers.

BACKGROUND

Test systems are configured to test the operation of electronic devices, such as microprocessors and memory chips. Testing may include sending signals to a device and determining how the device reacted to those signals based on its response. The device's reaction will dictate whether the device has passed or failed testing.

SUMMARY

An example test system includes a test carrier to receive a device to test. The test carrier includes test components to perform at least a structural test on the device. The example test system also includes a slot to receive the test carrier. The slot includes an interface to which the test carrier connects to enable the test carrier to communicate with a system that is part of the test system or external to the test system. The example test system may include one or more of the following features, either alone or in combination.

The structural test may be for performing component-level testing on the device. The structural test may include a parametric test. The structural test may include a scan test. The test components may be configured to perform a functional test on the device. The functional test may be for performing system-level testing on the device. The functional test may include providing an input to the device, obtaining an output based on the input, and determining whether the device has passed the functional test based on the output.

The example test system may include a printed circuit board (PCB) having the test components to perform at least a structural test on the device. The example test system may include robotics to move the test carrier into, and out of, the slot.

The example test system may include one or more additional test carriers. Each of the one or more additional test carriers may be configured to receive a different device to test. Each additional test carrier may include test components to perform at least a structural test on a different device. The example test system may include one or more additional slots. Each of the one or more additional slots may be configured to receive a target test carrier among the one or more additional test carriers. Each slot may include an interface to which the individual test carrier connects to enable the target test carrier to communicate with the system that is part of the test system or external to the test system.

Each test carrier may include a same type of test components. At least some of the additional test carriers may include different types of test components configured to perform different types of tests.

The device may be a first device. The test carrier may include a first receptacle to receive the first device and a second receptacle to receive a second device to test. The test components may be configured also to test the second device. The test components may be configured may be perform a same type of test on the first device and the second device. The test components may be configured to perform different types of tests on the first device and the second device. The different types of test may be performed asynchronously.

The test components may include memory storing data representing test stimulus vectors for use in the structural test. The test components may include one or more processing devices configured to execute instructions to perform to the structural test. The test components may include memory storing test results based on performance of the structural test. The test components may include an interface to enable exchange of communications with the system. The system may include a computing system. The communications may include instructions for performing testing originating at the computing system. The test results may originate at the test carrier.

The test components may include memory storing instructions comprising one or more test programs, and one or more processing devices to execute the instructions to perform the structural test on the device. The instructions define a test flow.

The system may include a computing system. The test carrier may be configured to receive, from the computing system, commands to change the test flow.

An example method includes receiving a device to test in a test carrier. The test carrier includes test components that perform at least a structural test on the device. The example method also includes receiving the test carrier in a slot. The slot includes an interface to which the test carrier connects to communicate with a system that is part of a test system or external to the test system. The test carrier communicates with the system based on the structural test. The example method may include one or more of the following features, alone or in combination.

The structural test may perform component-level testing on the device. The structural test may include a parametric test. The structural test may include a scan test. The test components may perform a functional test on the device. The functional test may perform system-level testing on the device. The functional test may provide an input to the device, obtain an output based on the input, and determine whether the device has passed the functional test based on the output.

An example test system includes means for receiving a device to test, where the means for receiving the device includes test components to perform at least a structural test on the device; means for receiving the test carrier, where the means for receiving the test carrier includes an interface to which the test carrier connects to enable the test carrier to communicate with a system that is part of the test system or external to the test system; and means for moving the test carrier into, and out of, the slot. The example test system may include one or more of following features, alone or in combination.

The example test system may include means for moving the device into, and out of, the means for receiving the device. The test components may be configured also to perform a functional test on the device.

Any two or more of the features described in this specification, including in this summary section, can be combined to form implementations not specifically described herein.

The systems and processes described herein, or portions thereof, can be implemented as/controlled by a computer program product that includes instructions that are stored on one or more non-transitory machine-readable storage media, and that are executable on one or more processing devices to control (e.g., coordinate) the operations described herein. The systems and processes described herein, or portions thereof, can be implemented as an apparatus, method, or electronic system that can include one or more processing devices and memory to store executable instructions to implement various operations.

The details of one or more implementations are set forth in the accompanying drawings and the description below. Other features, objects, and advantages will be apparent from the description and drawings, and from the claims.

DESCRIPTION OF THE DRAWINGS

Like reference numerals in different figures indicate like elements.

DETAILED DESCRIPTION

Described herein are example implementations of a carrier-based test system ("test system"). An example of such a test system includes a test carrier to receive a device to test. The test carrier includes electronics that comprise test components to perform at least a structural test on the device. A structural test includes testing individual components of the device. The test carrier may also include electronics comprising test components to perform a functional test on the device. A functional test includes testing an overall operation of the device. The test system includes a test slot ("slot") to receive the test carrier. The slot includes an interface to which the test carrier connects to enable the test carrier to communicate with a system that is part of the test system or external to the test system. Robotics may be configured and controlled to move the test carrier into, and out of, the slot during a testing process.

Figure 1:
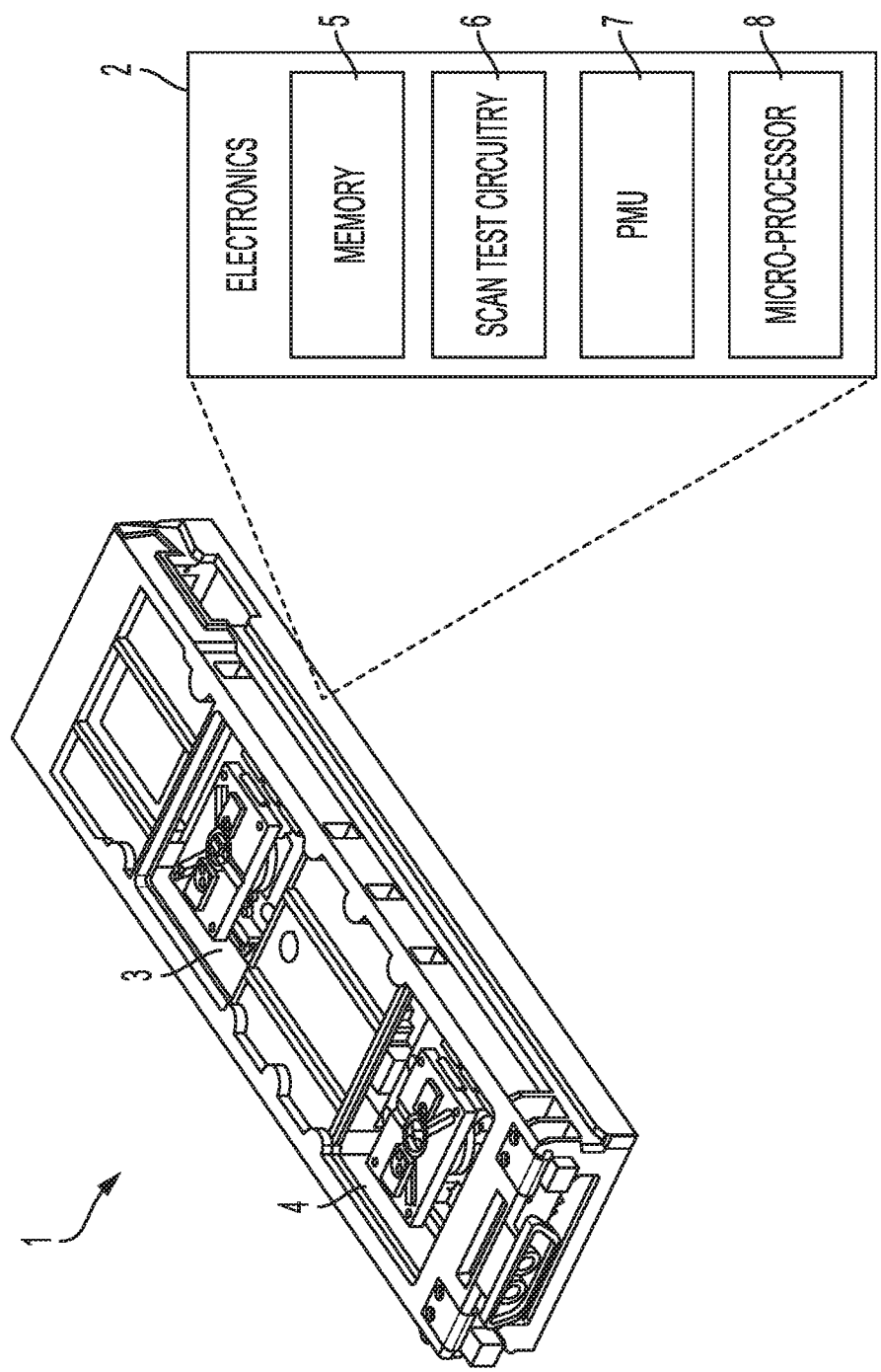
FIG. 1 is a perspective view of an example carrier for a test system.

FIG. 1 shows an example of a test carrier 1. In some implementations, test carrier 1 is self-contained, portable, and movable into, and out of, a slot. Test carrier 1 includes electronics 2 comprising test components configured to perform structural tests, functional tests, or both structural and functional tests on a device held in the test carrier. In this regard, test carrier 1 includes receptacles for holding devices to test. The receptacles contain one or more interfaces that are configured to connect devices to the test carrier both mechanically and electrically. In test carrier 1, the receptacles include two test sockets 3 and 4 arranged along the test carrier's longitudinal dimension. Although two test sockets are shown, other implementations of the test carrier may contain more than, or fewer than, two test sockets. The test sockets may also be arranged differently than as shown in FIG. 1. For example, the test sockets may be arranged along the lateral dimension.

As noted, example electronics 2 may be incorporated into the test carrier itself to perform one or more tests on a device in a test socket. Electronics 2 are internal to the test carrier, and are shown in block form in FIG. 1. Electronics 2 may be included on a printed circuit board (PCB) that is part of the test carrier.

Electronics 2 may include memory 5 storing data representing test stimulus vectors for use in a structural test, a functional test, or both a structural test and a functional test. Circuitry, such as that described below, may retrieve all or some of the data from memory and generate stimulus signals or test data based on the retrieved data.

Electronics 2 may include scan test circuitry 6. Generally, an example scan test includes gaining access to internal nodes of device under test (DUT), shifting bits into registers in those internal nodes, and monitoring the response of those internal nodes to the bits in the registers. In an example scan testing system, memory elements, such as latches or flip-flops, are connected to form a shift register, called a scan register. The internal state of a DUT may be controlled by shifting, into the scan register, test data for application to individual components of the DUT. The states of the individual components may be obtained by shifting-out data stored in the scan register.

An example of a scan test system that may be implemented using scan test circuitry 6 includes a level sensitive scan design system (LSSD). In an example LSSD, shift register latches operate as basic building blocks in a logic organization. Clock trains control groups of the shift register latches to shift data into, and out of, the shift register latches. Independent accessing and controls are also provided for these latches for independent scan-in/scan-out functions to be performed.

Electronics 2 may include a parametric measurement unit (PMU) 7 for performing parametric tests on a device in a socket. An example type of PMU that may be used includes a per-pin PMU (PPMU). Example parametric tests may include DC (direct current) parametric tests, AC (alternating current) parametric tests, or both AC and DC parametric tests. In a parametric test, the parametric measurement unit forces a current or voltage stimulus signal to a pin on the DUT, measures a response to the stimulus signal, and compares the measurement to an expected metric.

In this regard, the response to the stimulus signal may include electrical signals. An electrical signal includes informational content—data transmitted, for example. Electrical signals also include associated parametric information, such as signal-to-noise ratio, modulation amplitude, extinction ratio, wavelength, rise time, fall time, slew rate, or any other characteristic relating to a wave or the wave's shape. The PMU may obtain the parametric information from the electrical signals sent in response to stimulus signals, and compare the parametric information to one or more expected metrics. If the parametric information is deemed to be acceptable, components of the DUT associated with the pin that receives the input signals may pass testing. Otherwise, those components may fail testing. The PMU may also determine whether the information content of the electrical signals sent in response to the stimulus signals is as expected. For example, the voltage or current of the electrical signal may be compared to reference voltages or currents. If the informational content is deemed to be acceptable, components of the DUT associated with the pin that receives the input signals may pass testing. Otherwise, those components may fail testing.

Electronics 2 may include one or more processing devices, such as microprocessor 8. Microprocessor 8 may be configured—for example, programmed—with instructions to implement structural tests, functional tests, or both structural and functional tests on a DUT in a test carrier socket. As noted, a structural test includes performing component-level testing on the device. A functional test includes performing system-level testing on the device. An example functional test includes providing an input—such as a stimulus signal—to the DUT, obtaining an output from the DUT based on the input, and determining whether the device has passed the functional test based on the output. For example, the output may be compared to one or more metrics by the microprocessor. If the comparison indicates that the DUT's output is within an acceptable range, the DUT passes testing. Otherwise, the DUT fails. In a functional test, multiple outputs may be obtained from the same DUT and compared to one or more metrics as part of the testing process.

As described below, a test system may include multiple test carriers, such as the test carrier shown in FIG. 1. In some implementations, two or more different test carriers in the same test system may include different types or numbers of test components to perform structural tests, functional tests, or both structural and functional tests on a device held in the test carrier. In some implementations, two or more different test carriers in the same test system may include the same types or numbers of test components to perform structural tests, functional tests, or both structural and functional tests on a device held in the test carrier. In some implementations, all test carriers in the same test system may include the same types or numbers of test components to perform structural tests, functional tests, or both structural and functional tests on a device held in the test carrier.

As noted, the example test carrier of FIG. 1 includes two test sockets, each for housing a different DUT. The testing performed on the two DUTs may be the same type of testing or different types of testing. For example, parametric tests may be performed on one DUT while scan tests are performed on a different DUT. For example, functional tests may be performed on one DUT while structural tests are performed on a different DUT. The two DUTs may be tested synchronously or asynchronously. The preceding is also true for test carriers that are configured to hold and to test, more than two DUTs. For example, testing performed on all DUTs in the test carrier may be the same type of testing or different types of testing. For example, parametric tests may be performed on one or more DUTs while scan tests are performed on one or more different DUTs. For example, functional tests may be performed on one or more DUTs while structural tests are performed on one or more different DUTs. The multiple DUTs may be tested synchronously or asynchronously. In some implementations, structural testing and functional testing may be performed simultaneously or contemporaneously on the same DUT. For example, structural and functional testing may be performed on the same DUT at the same time, or parts of the structural and functional testing may overlap in time.

In some implementations, testing performed on the test carriers may be initiated by, or controlled by, a computing system that is external to the test carrier but that is in communication with the test carrier. Example implementations of such a computing system are described herein. In some implementations, testing performed on the test carriers may be initiated by, or controlled by, electronics that is external to the test carrier but that is in communication with the test carrier. Example implementations of such electronics include components in a rack that holds the test carrier The testing performed by the test carriers may be independent of, or may complement, other testing performed by the test system. For example, as described below, the test system may perform tests on DUTs in a test carrier while the test carrier is inside a slot of the test system. The testing may be conducted by electronics contained in the slot or in a test rack holding the slot. The tests may include structural tests, functional tests, or both structural test and functional tests.

As noted, the testing performed on the test carriers may complement other testing performed by the test system. For example, outputs from the testing performed on the test carriers may be provided to the electronics contained in the slot, electronics contained in the test rack holding the slot, or the computing system. The electronics contained in the slot, electronics contained in the test rack holding the slot, or the computing system may analyze those outputs or integrate those outputs into test results generated separately by the electronics contained in the slot, electronics contained in the test rack holding the slot, or the computing system. Likewise, the electronics contained in the slot, electronics contained in the test rack holding the slot, or the computing system may output test results to components (electronics 2) on the test carrier. The components may use those external test results when performing on-carrier tests of a DUT.

Figure 2:
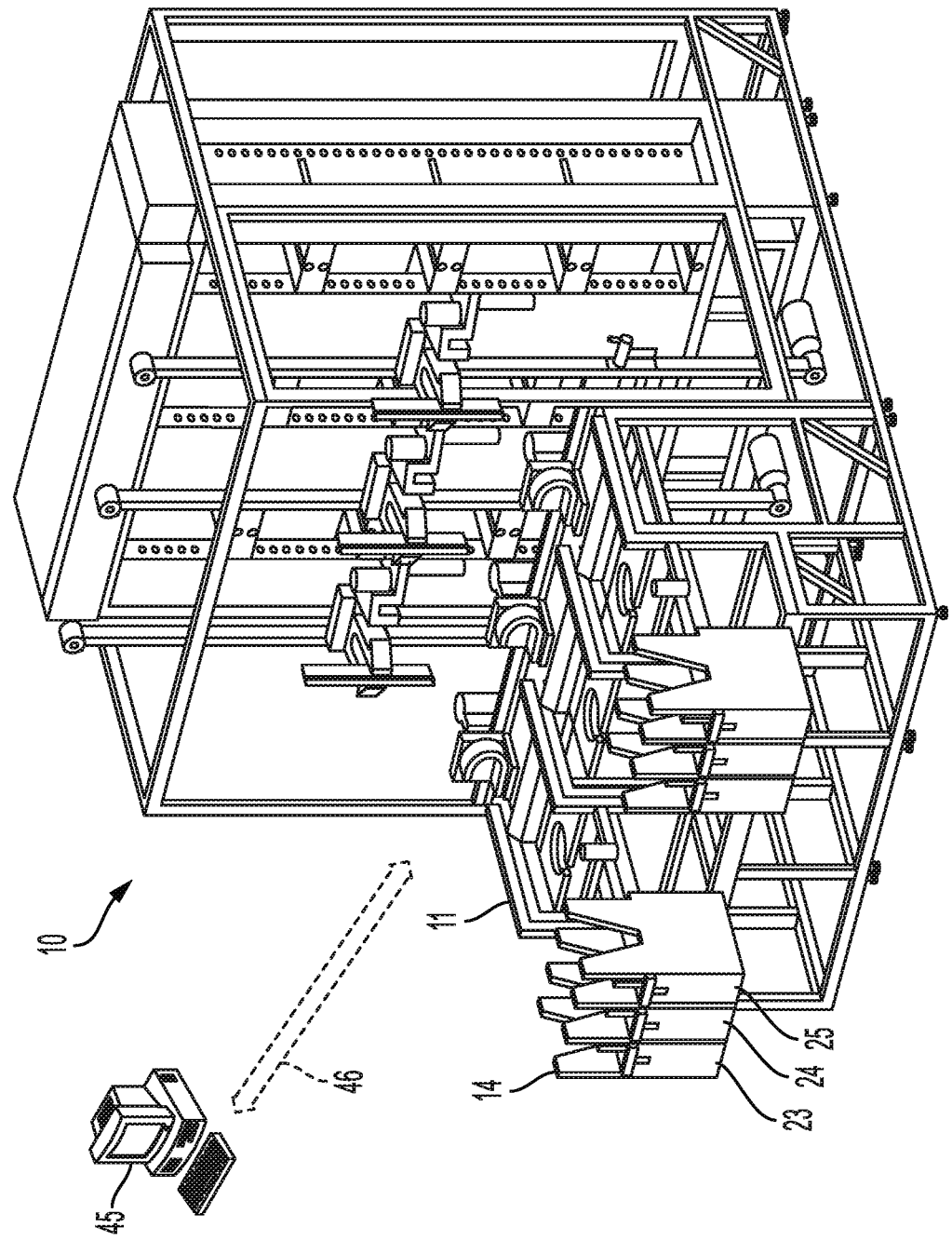
FIG. 2 is a perspective view of an example test system.
Figure 3:
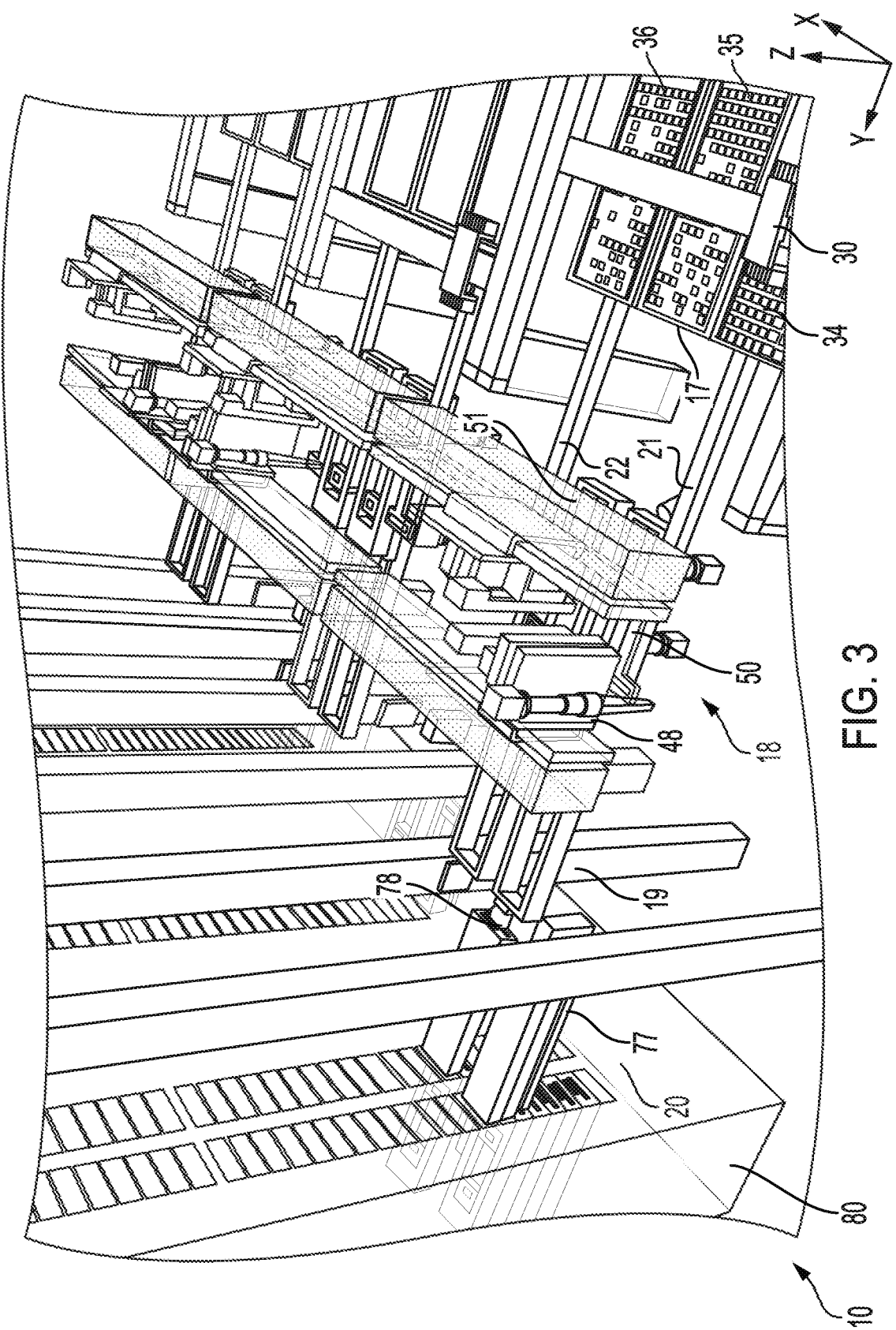
FIGS. 3 and 4 are perspective views showing examples of internal components of the test system of FIG. 2 at different configurations during operation.
Figure 4:
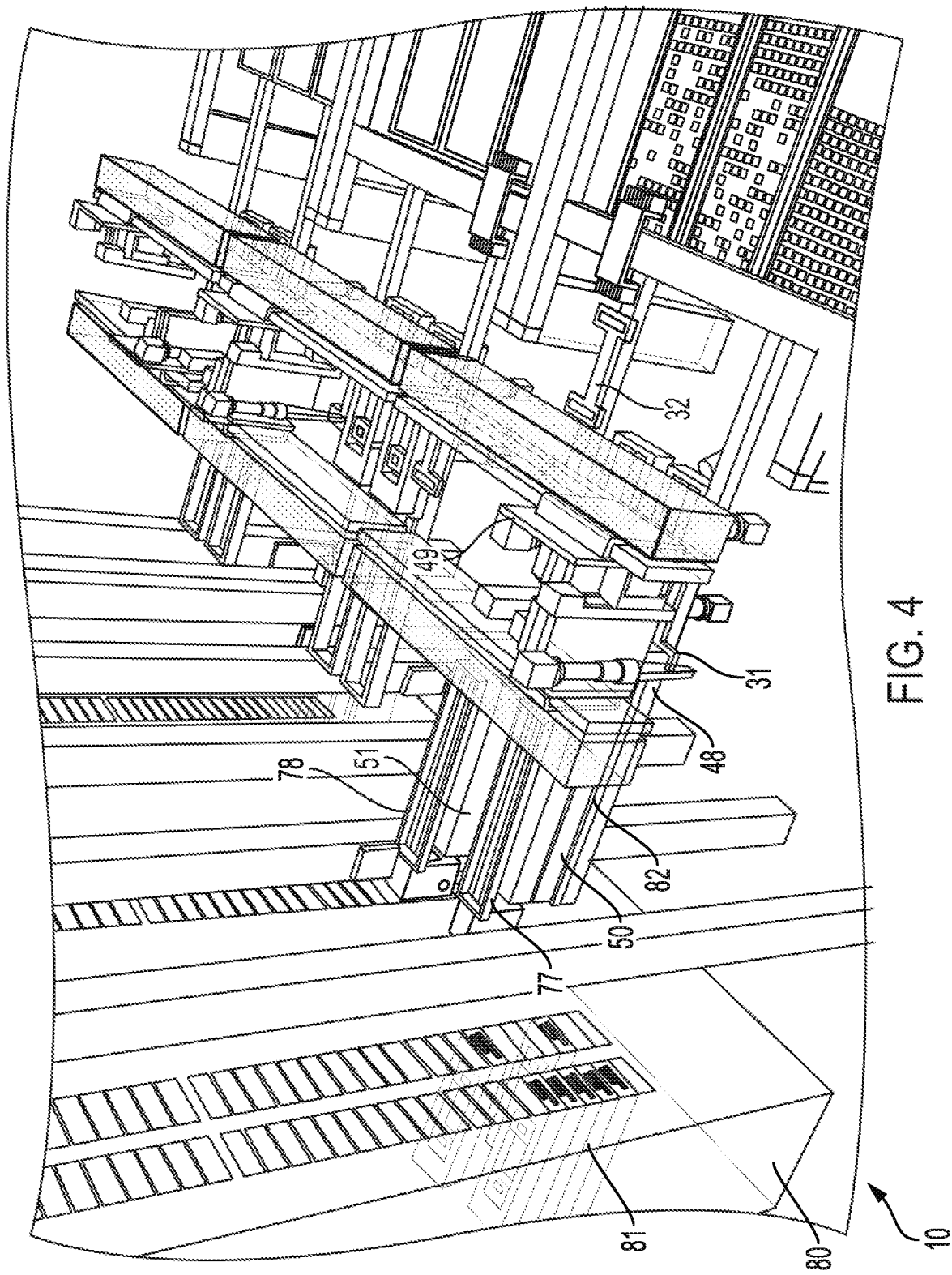

FIGS. 2 to 4 show components of an example test system 10 in which the test carrier described above and with respect to FIG. 1 may be used. In some implementations, the example test system is modular, enabling the test system to accommodate various testing requirements. Each unit of the test system is referred to as a slice. Two or more slices may be combined and controlled to operate in concert (e.g., dependently) or independently to perform testing operations.

Referring to FIGS. 2 and 3, example test system 10 includes five stages (or zones) per slice; however, any appropriate number of stages may be included in the test system. In an example implementation, the five stages include an input/output (I/O) stage 14 a transport stage 17, a loading stage 18, an insertion stage 19, and a test stage 20. The definitions of the various stages are not meant to be limiting, and one or more components may perform functions in two or more of the stages. In some implementations, different stages are configured to operate with different levels of precision. For example, higher levels of precision (e.g., down to the micron level) may be used in the loading stage, whereas lower levels of precision may be used in some or all other stages. System components, such as mechanical components, may be configured for operation within tolerances that enable lower levels of precision in some stages. By relegating higher precision to stages that may require it, the cost and complexity of the test system can be controlled in some cases.

Computing system 45 communicates with test system 10 to control, and to coordinate operations of, test system 10. Computing system 45 may include one or more processing devices, examples of which are described herein. Communications between test system 10 and computing system 45 are represented by dashed arrow 46.

The different stages of the test system may operate independently and contemporaneously. In the example of FIG. 3, each stage includes two parallel paths 21 and 22. Each of the parallel paths includes automation, such as robotics, to pass test carriers, devices, or both between adjacent stages. Operation of the different stages independently, contemporaneously, and in the parallel paths may support higher testing throughput and speed than some comparable test systems In the example of FIG. 2, I/O stage 14 includes, but is not limited to, feeders for receiving trays of tested devices, and for providing trays of untested devices to the test system. In the example of FIG. 2, there are three feeders 23, 24, 25 per slice; however, the system is not limited to use with three feeders. A first feeder 23 is for trays containing untested devices; a second feeder 24 is for trays containing tested devices that have not passed testing, and a third feeder 25 is for trays containing devices that have passed testing. In this example, feeder 23 is loaded manually with trays of untested devices. A tray among a stack of trays containing untested devices is fed from feeder 23 to the transport stage 17. After all devices on that tray have been forwarded for testing, and the tray is empty, the tray is retracted into the feeder and a new tray containing untested devices is fed to the transport stage. After devices have been loaded onto that tray following testing, and the tray is full (in some implementations), the tray is retracted into the feeder and a new, empty tray is fed from the I/O stage to the transport stage from either feeder 24 or 25. In this example, operations of feeders 24 and 25 are the same for trays containing devices that have passed testing and trays containing devices that have not passed testing.

In this example, transport stage 17 includes, but is not limited to, a transport robot 30 (e.g., FIG. 3) and two device shuttles 31, 32 (e.g., FIG. 4). The two device shuttles provide parallel transport paths, both into, and out of, the loading stage 18 described below, and support testing throughput and redundant reliability in some examples. Transport robot 30 is controllable to pick untested devices from a tray 34 (e.g., FIG. 3) and to place the untested devices onto device shuttles 31 and/or 32 (e.g., FIG. 4). Transport robot 30 is controllable to pick tested devices from device shuttles 31 and 32, and to place the tested devices into an appropriate one of trays 35 or 36, depending upon whether a particular device has passed testing or has not passed testing. In some implementations, transport robot 30 may pick and hold the device through air suction or using mechanical grips or other mechanical mechanisms.

In some implementations, the two devices shuttles may be configured and controlled to operate in parallel, independently, contemporaneously, and/or concurrently. For example, the transport robot may provide one device shuttle with devices to be tested, while removing devices that have been tested from another device shuttle. The two devices shuttles may be configured to move between the loading stage and the transport stage independently, in parallel, contemporaneously, and/or concurrently. For example, one device shuttle may transport devices to be tested from the transport stage towards, and to, the loading stage, while the other device shuttle transports devices that have been tested away from the loading stage and to the transport stage. In addition, one device shuttle may be stationary while the other device shuttle is moving. For example, one device shuttle may receive devices to be tested while the other device shuttle transports devices to or from the loading stage.

In some implementations, loading stage 18 includes, but is not limited to, loading robots 48, 49 and an area for loading devices into, and unloading devices from, test carriers, such as 50 and 51. In this example, there are two loading robots per slice; however, the test system may include any appropriate number of loading robots. In this example, loading robots 48, 49 are configured to move in the X dimension and also in the Z dimension to perform pick-and-place operations on devices. For example, untested devices are picked-up from a shuttle and moved into a test carrier for testing, and tested devices are picked-up from a test carrier and moved to a shuttle.

In the example of FIGS. 3 and 4, two test arms 77, 78 are shown per slice; however, the test system may include any appropriate number of test arms. The test arms are movable in all three dimensions—X, Y and Z, including rotations and flipping, in order to insert test carriers containing untested device into test slots in the test rack, and to extract, or to remove, test carriers containing tested devices from the test slots in the test rack. Test carriers containing tested devices are moved back to the loading stage, where the devices are unloaded onto shuttles by the loading robots.

Each test arm is configured to hold two test carriers at the same time—one on each face or side of the test arm. In some implementations, each side of a test arm (e.g., 77 or 78) includes a test carrier-holding receptacle, such as a gripper, for receiving, for holding, and for releasing a test carrier. In an example, the gripper is spring-loaded to accept a test carrier containing untested devices from a test carrier shuttle, and to release a test carrier containing tested to device to the (same or different) test carrier shuttle. The test carrier shuttle may be configured to control opening and closing of each gripper. A test carrier shuttle 82 may move the test carrier between the test arm and loading position.

Test rack 80 includes multiple test slots. Test carriers 81 are shown inside corresponding slots of the test rack. Each test slot may be configured and controllable to test devices in the test sockets on a test carrier, and to report the test results back to the computing system controlling the test system. The computing system keeps track of which devices passed testing and which devices failed testing, sorts the devices accordingly, and reports the test results. A test slot in the test rack is serviced by a test arm. In some implementations, during testing, a test slot always remains occupied except for the short time during which test carriers are exchanged in the test slot. For example, a test arm 77 or 78 may arrive at a test slot while holding a test carrier containing untested devices, extract a test carrier containing tested devices from the test slot, and insert the test carrier containing untested devices into that same test slot from which the other test carrier was extracted. Thus, except for the time between the removal and insertion of the test carriers, the test slot remains occupied. Each test slot in the test rack may be serviced in this manner to enhance testing throughput. Examples of how test carriers are inserted and extracted are provided below.

In operation, a test arm 77 or 78 moves—e.g., flips and rotates—to position itself to pick-up a test carrier containing untested devices from a test carrier shuttle such as test carrier shuttle 50, and to deposit the test carrier containing tested devices onto the (same or different) test carrier shuttle. In this example, the test carrier rotates (e.g., about 180°) and flips. The rotation is about a longitudinal axis of the test arm and the flipping includes a rotation in the Y dimension. As a result of this movement, an empty, first gripper on the test arm is in position to pick-up a test carrier containing untested devices from the test carrier shuttle. Accordingly, the first gripper is controlled to pick-up the test carrier containing untested devices from the test carrier shuttle. The test arm then rotates along its longitudinal axis at a point above, or proximate to, the test carrier shuttle to position a test carrier containing tested devices for deposit onto the test carrier shuttle. A second gripper on the test arm that is holding the test carrier is opened, resulting in the test carrier containing the tested devices being deposited on the test carrier shuttle. Thereafter, the test carrier shuttle transports the test carrier containing the tested devices to the loading stage.

At this time, therefore, the second gripper is empty and the first gripper holds a test carrier containing untested devices. Accordingly, the test arm rotates and flips to position the test arm to service a test slot. The test arm may also move vertically to position itself in front of a target test slot to be serviced. This rotation and flipping is opposite to the rotation and flipping performed to position the test arm above the test carrier shuttle. Thus, the test arm is positioned to extract, or to receive, from the target test slot, a test carrier containing devices that have been tested. The test carrier containing devices that have been tested is received into the theretofore empty second gripper. Following receipt of the test carrier containing devices that have been tested, the test arm rotates to position the test carrier in the first gripper, which contains devices that have not been tested, into position for insertion into the same test slot. Thereafter, the test carrier containing devices that have not been tested is pushed into that test slot, and the foregoing operations are repeated, slot-by-slot.

Example implementations of a system like that of FIGS. 2 to 4 are described in U.S. patent application Ser. No. 15/688,112, which was filed on Aug. 28, 2017 and which is titled "Calibration Process For An Automated Test System". U.S. patent application Ser. No. 15/688,112 is incorporated herein by reference. For example, the robotics and other components of input/output (I/O) stage 14, transport stage 17, loading stage 18, insertion stage 19, and test stage 20 are incorporated by reference into this application from U.S. patent application Ser. No. 15/688,112.

As noted, FIG. 4 shows an example of a test carrier 51. As also noted, test sockets and electronics are included in the test carrier. In some implementations, a test socket is device-specific. For example, the test socket may contain electrical contacts that are complementary to corresponding electrical contacts on a device under test (DUT). Among other things, the loading robots may be configured to place untested devices into test sockets, and to remove tested devices from test sockets. The test sockets are included in the test carrier, and contain walls that may guide devices under test into position so that electrical contacts in the test carrier test socket and electrical contacts on the device under test align. In some implementations, for example, where the electrical contacts are relatively large, the loading robots may not require a high level of precision, and the test socket walls may play a prominent role in guiding devices under test into position so that electrical contacts in the test carrier test socket and electrical contacts on the device under test align.

After an untested device reaches a resting position within the test socket, a socket cap is placed over the test socket, among other things, to apply pressure to the device to cause the electrical contacts in the device under test to mate to the complementary electrical contacts in the test carrier. In some implementations, the socket cap may include memory storing executable instructions that are usable by the device or by a microprocessor on the carrier during test. For example, the executable instructions may include operational instructions, test routines, and so forth. Accordingly, the socket cap may also include electrical contacts that mate to complementary electrical contacts on the device and/or the test carrier. In some implementations, the socket cap exerts of force on the device in order to implement the various electrical connections; any appropriate amount of force may be applied to implement connections. In some implementations, as described herein, the socket cap may be, or include, a kinematic mount, that applies the force via a compression spring.

Other test systems in which the test carrier described above and with respect to FIG. 1 may be used include, but are not limited to, the disk drive test system described in U.S. Pat. No. 7,848,106, which issued on Dec. 7, 2010, and which is titled "Temperature Control Within Disk Drive Testing Systems". U.S. Pat. No. 7,848,106 is incorporated herein by reference. For example, the robotics and test slots are incorporated by reference into this application from U.S. Pat. No. 7,848,106.

The example systems described herein may be implemented using, and/or controlled using, one or more computer systems comprising hardware or a combination of hardware and software. For example, a system like the ones described herein may include various controllers and/or processing devices located at various points in the system to control operation of the automated elements. A central computer may coordinate operation among the various controllers or processing devices. The central computer, controllers, and processing devices may execute various software routines to effect control and coordination of the various automated elements.

The example systems described herein can be controlled, at least in part, using one or more computer program products, e.g., one or more computer program tangibly embodied in one or more information test carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing can be performed by one or more programmable processors executing one or more computer programs to perform the functions described herein. All or part of the testing can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "connection" as used herein may imply a direct physical connection or a wired or wireless connection that includes or does not include intervening components but that nevertheless allows signals to flow between connected components.

Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

What is claimed is:

1. A test system comprising:
a test carrier to receive a device to test, the test carrier comprising test components to perform, on the test carrier, at least a structural test on the device; and
a slot in a test rack, the slot being configured to receive the test carrier, the slot being configured to connect to the test carrier to enable the test carrier to communicate with a system that is part of the test system or external to the test system;
wherein at least the structural test is independent of testing performed on the device by components that are not on the test carrier when the test carrier is in the slot.

2. The test system of claim 1, wherein the test components comprise test electronics, and wherein the structural test is for performing component-level testing on the device.

3. The test system of claim 1, wherein the structural test comprises a parametric test.

4. The test system of claim 1, wherein the structural test comprises a scan test.

5. The test system of claim 1, wherein the test components comprise test electronics, and wherein the test components are configured to perform a functional test on the device.

6. The test system of claim 5, wherein the functional test is for performing system-level testing on the device.

7. The test system of claim 5, wherein the functional test comprises providing an input to the device, obtaining an output based on the input, and determining whether the device has passed the functional test based on the output.

8. The test system of claim 1, wherein the test carrier comprises a printed circuit board (PCB) for holding test electronics comprising the test components to perform at least the structural test on the device.

9. The test system of claim 1, further comprising:
robotics to move the test carrier into, and out of, the slot.

10. The test system of claim 1, wherein the test carrier is a first test carrier, the device is a first device, and the slot is a first slot; and
wherein the test system further comprises:
one or more additional test carriers, each of the one or more additional test carriers to receive a different device to test, each additional test carrier comprising test components to perform at least a structural test on a different device; and
one or more additional slots, each of the one or more additional slots to receive a target test carrier among the one or more additional test carriers, each slot being configured to enable the target test carrier to communicate with the system that is part of the test system or external to the test system.

11. The test system of claim 10, wherein each test carrier comprises a same type of test components.

12. The test system of claim 10, wherein at least some of the additional test carriers comprise different types of test components configured to perform different types of tests.

13. The test system of claim 1, wherein the device is a first device;
wherein the test carrier comprises a first receptacle to receive the first device and a second receptacle to receive a second device to test; and
wherein the test components are configured also to test the second device.

14. The test system of claim 13, wherein the test components are configured to perform a same type of test on the first device and the second device.

15. The test system of claim 13, wherein the test components are configured to perform different types of tests on the first device and the second device.

16. The test system of claim 15, wherein the different types of test are performed asynchronously.

17. The test system of claim 1, wherein the test components comprise memory storing data representing test stimulus vectors for use in the structural test.

18. The test system of claim 1, wherein the test components comprise one or more processing devices configured to execute instructions to perform to the structural test.

19. The test system of claim 1, wherein the test components comprise memory storing test results based on performance of the structural test.

20. The test system of claim 19, wherein the test components comprise an interface to enable exchange of communications with the system, the system comprising a computing system, the communications comprising instructions for performing testing originating at the computing system, the test results originating at the test carrier.

21. The test system of claim 1, wherein the test components comprise:
memory storing instructions comprising one or more test programs; and
one or more processing devices to execute the instructions to perform the structural test on the device, the instructions defining a test flow.

22. The test system of claim 21, wherein the system comprises a computing system; and
wherein the test carrier is configured to receive, from the computing system, commands to change the test flow.

23. A method comprising:
receiving a device to test in a test carrier, the test carrier comprising test components to perform at least a structural test on the device;
performing, in the test carrier, at least the structural test on the device;
receiving the test carrier in a slot of a test rack, the slot being configured to enable the test carrier to communicate with a system that is part of a test system or external to the test system; and
the test carrier communicating with the system based on the structural test;
wherein at least the structural test is independent of testing performed on the device by components that are not on the test carrier when the test carrier is in the slot.

24. The method of claim 23, wherein the structural test performs component-level testing on the device.

25. The method of claim 23, wherein the structural test is a parametric test.

26. The method of claim 23, wherein the structural test is a scan test.

27. The method of claim 23, wherein the test components comprise test electronics, and wherein the test components perform a functional test on the device.

28. The method of claim 27, wherein the functional test performs system-level testing on the device.

29. The method of claim 27 wherein the functional test provides an input to the device, obtains an output based on the input, and determines whether the device has passed the functional test based on the output.

30. A test system comprising:
a test carrier for receiving a device to test, the test carrier comprising test components to perform, on the test carrier, at least a structural test on the device;
means for receiving the test carrier, the means for receiving the test carrier being configured to enable the test carrier to communicate with a system that is part of the test system or external to the test system; and means for moving the test carrier into, and out of, the means for receiving;

wherein at least the structural test is independent of testing performed on the device by components that are not on the test carrier when the test carrier is in the means for receiving.

31. The test system of claim 30, further comprising:

means for moving the device into, and out of, the test carrier.

32. The test system of claim 30, wherein the test components are configured also to perform a functional test on the device.

* * * * *